United States Patent [19]

Thomas

[11] Patent Number: 5,359,726

[45] Date of Patent: Oct. 25, 1994

[54] FERROELECTRIC STORAGE DEVICE USED IN PLACE OF A ROTATING DISK DRIVE UNIT IN A COMPUTER SYSTEM

[76] Inventor: Michael E. Thomas, 201 S. 4th St. #629, San Jose, Calif. 95112

[21] Appl. No.: 895,328

[22] Filed: Jun. 8, 1992

Related U.S. Application Data

[63] Continuation-in-part of Ser. No. 374,822, Jul. 3, 1989, abandoned, which is a continuation of Ser. No. 288,160, Dec. 22, 1988, abandoned.

[51] Int. Cl.⁵ ............. G06F 3/00; G06F 13/00; G11C 11/22
[52] U.S. Cl. ................. 395/500; 395/425; 365/145; 364/DIG. 1
[58] Field of Search ............... 395/425, 500; 364/200 MS, 900 MS; 365/145

[56] References Cited

U.S. PATENT DOCUMENTS

| | | | |
|---|---|---|---|
| 3,866,187 | 2/1975 | Dougherty et al. | 365/125 |
| 4,280,219 | 7/1981 | Lowenschuss et al. | 375/4 |
| 4,295,205 | 10/1981 | Kunstadt | 395/425 |
| 4,456,971 | 6/1984 | Fukuda et al. | 395/500 |
| 4,467,421 | 8/1984 | White | 395/425 |
| 4,710,789 | 12/1987 | Furutani et al. | 365/149 |
| 4,727,512 | 2/1988 | Birkner et al. | 395/500 |
| 4,896,262 | 1/1990 | Wayama et al. | 395/500 |
| 4,958,315 | 9/1990 | Balch | 364/900 |

OTHER PUBLICATIONS

OEM Reference & Maintaince Manual 5.25 Inch Winchester Disk Drive, Models 5006H, 5012H, 5018H.
Weber, "A New Memory Technology Is About To Hit The Market," Electronics, Feb. 18, 1988, pp. 91–94.
Horton et al., "Nonvolatile PRAMs Fit Standard Memory Applications," Electronic Products, Jun. 1, 1988, pp. 41–46.
Ramtron Corporation, Colorado Springs, Colo., Article Reprints and Technical Papers on Ferroelectric Devices, 1989.

Primary Examiner—Glenn Gossage
Attorney, Agent, or Firm—Falk, Vestal & Fish

[57] ABSTRACT

A method and apparatus are disclosed for emulating a rotating disk drive using a removable ferroelectric solid state storage device in a microprocessor controlled storage system. The removable ferroelectric solid state storage device has non-volatile memory integrated circuit components in a ferroelectric random access memory (FRAM) pack. The ferroelectric memory pack utilizes the same read/write recording techniques as those for transferring data between a host computer and a rotating disk drive.

12 Claims, 12 Drawing Sheets

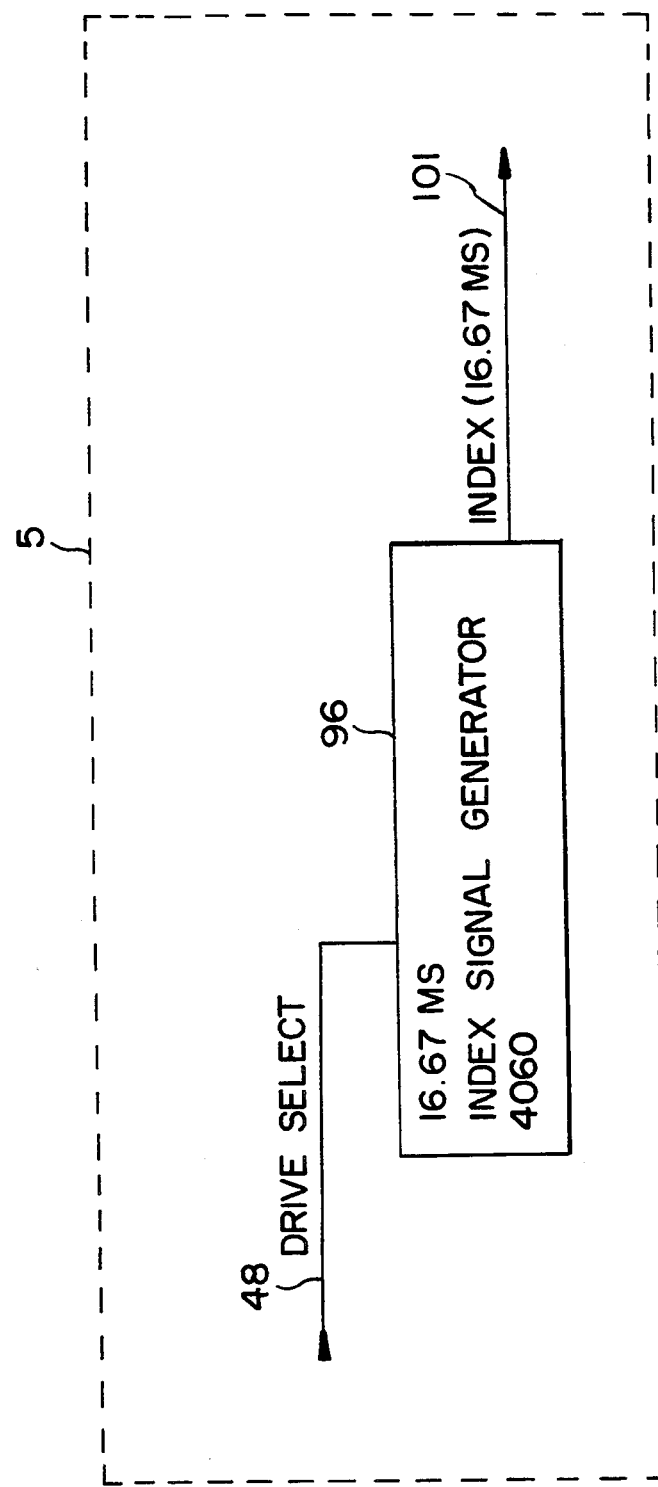

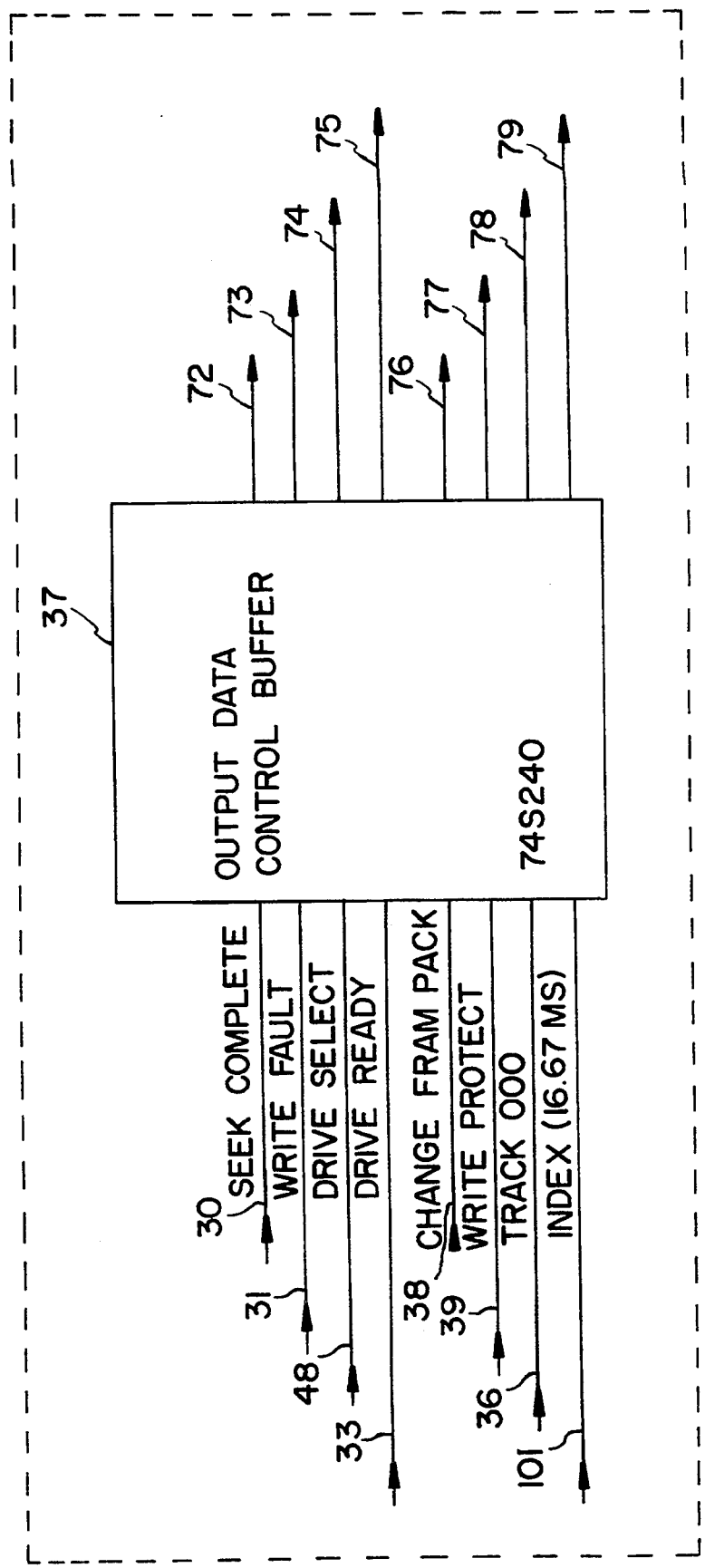

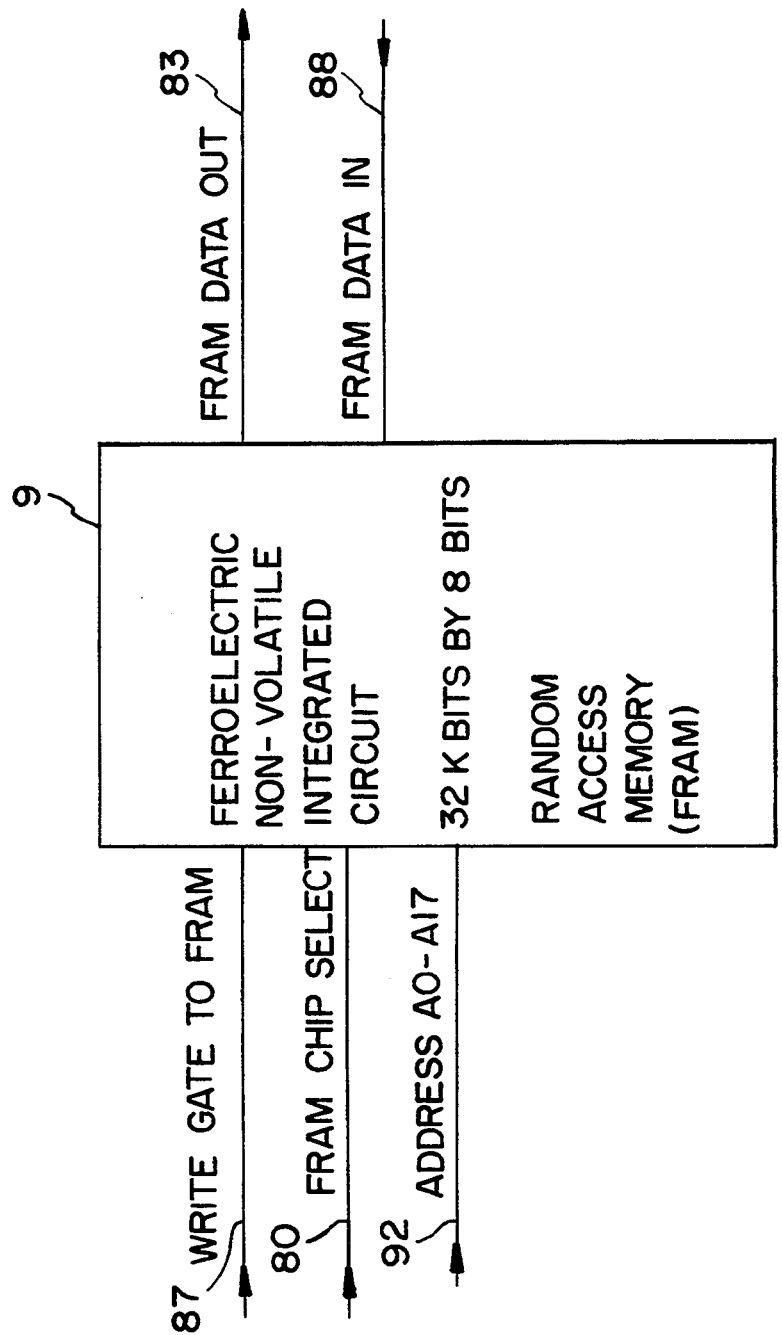

FERROELECTRIC STORAGE DEVICE USED IN PLACE OF A ROTATING DISK DRIVE UNIT IN A COMPUTER SYSTEM

RELATED APPLICATIONS

This is a continuation in part of U.S. Letters patent application Ser. No. 07/374,822 filed Jul. 3, 1989 now abandoned, which is a continuation of U.S. Letters patent application Ser. No. 07/288,160 filed Dec. 22, 1988, also now abandoned, both of which are incorporated herewith.

TECHNICAL FIELD OF THE INVENTION

This invention relates to a rotating disk drive in a computer system and, more particularly, is related to a storage device used in place of a rotating disk drive unit in a computer system.

BACKGROUND OF THE INVENTION

Floppy disk drives have relatively slow access, low storage, and primitive data transfer rates, with no capability for fast data interaction on today's 16 and 32 bit computer systems.

For many years, the 5.25 inch floppy disk drive has been a dinosaur in the high technology fast-moving data processing field.

5.25" Winchester disk drives have been heralded as the only new high capacity, high data transfer rate input/output (I/O) device for the personal computer. It took years even with high technology, for aggressive companies to optimize and miniaturize the components necessary for Winchester disk drives for low cost, small size, and high capacity requirements. Servo linear positioning motors weighing 50 lbs. with dimensions of 12 inches by 8 inches have been replaced by the present 3 inch by 1.5 inch units weighing 0.5 lb. Step motors having 2 phases with 18 degree increments have given way to present 5 phase motors with 0.72 degree step increments with micro-step, ramp-up, and ramp-down capabilities. Thus, present Winchester disk drives allow a microcomputer to control the absolute position of the read/write (R/W) heads in a manner similar to the closed loop servo actuated systems.

Past spindle drive systems utilized large cumbersome motors using belt-driven spindles. The insurgence of numerous drive manufacturers to miniaturize this large cumbersome device has brought about the creation of a "pancake style" spindle motor which uses multi-layered printed circuit board technology.

A present pancake style motor with a thickness of 0.25 inches can now generate the torque needed to spin the plated media used for the storage in a Winchester drive.

The I/O controllers for the hard disk drives of yesterday were customized boards 48 inches by 48 inches with data transfer rates of 500 kilobits/sec. These complex, bulky boards required extensive interconnection cabling and sensitive boot software to set-up on-board logic necessary to perform the required data interaction between the host system and the hard disk drive. There are now many standard Winchester controllers of small size incorporating various advanced data retrieval systems. Modern devices typically have dimensions of 5.25 inches by 6 inches and are easily adaptable to many of the personal computers on the market with the added feature of data transfer rates in excess of 5 megabits/sec. Software has been created to run the high tech drives that interface to the 16/32 bit microsystems, and many thousands of hours have been spent across the nation to accomplish this task.

The media and heads are the key and essential ingredients for the continued success of the 5.25 inch Winchester market. Equipment previously used for making integrated circuits began being used for making cobalt-coated 600 oersted 0.75 inch aluminum substrates for the demanding appetite of the 5.25 inch Winchester market. Unfortunately, this type of media is very expensive to produce. It has high material costs and low yields, and requires expensive manufacturing equipment.

Further, the R/W heads are even more difficult to produce in adequate volumes and low costs.

2.00/3.5 inch floppy disk cartridge drive were next to appear on the market. With its small size, plastic molded parts, and a metal hub ring that allows the medium to be rotated at a 360/600 rpm speed, this cartridge had the effect of taking the flexible tape diskette from a primarily back-up storage device of slow speed to a medium capacity data storage device with relatively slow data transfer rates. Thus, the 2.00 inch by 3.50 inch floppy disk cartridge has solved none of today's needs for a small size storage tape backup device for the 5.25 inch Winchester disk drive (with storage capabilities now approaching 600 million bytes in a 5.25 inch package).

In the art at the time of the writing of this application, a wide trade-off exists. A fixed media such as a Winchester disk has a very high storage capacity and relatively high access speed. However, in using a Winchester disk, if there is a problem with the storage media (the disk itself) it must be professionally replaced. Moreover, since the storage capacity is unexpandable, the total storage capacity of a fixed drive system such as a Winchester disk is equal to the amount of total storage on the single Winchester drive itself.

In contrast, solid state ferroelectric integrated circuit non-volatile memory, hereinafter referred to as, Ferroelectric Random Access Memory or "FRAM®" memory, has a relatively small storage capacity, no special requirements and no access time. "FRAM" is a registered trademark of RAMTRON Corporation of Colorado Springs, Col. Moreover, removable ferroelectric non-volatile memory packs—a pack having multi-layers of the same type board with a board consisting of many FRAM units on a single printed circuit board—may be interchanged, thus allowing the user to compile a library of packs. By buying a single drive and a plurality of packs, the user can thereby obtain many times the storage amount as found on a single Winchester drive by accumulating many removable solid state memory FRAM packs.

Prior art techniques replacing rotating memory systems with solid state memory have been used for purposes other than using non-volatile solid state memory utilizing recording techniques for transferring data to rotating memory storage. For example, U.S. Pat. No. 4,298,956, discloses a digital read recovery with variable frequency using read only memory (ROM) integrated circuits. Another example is, U.S. Pat. No. 3,573,762, which discloses non-volatile read/write storage devices and non-volatile memory for control functions.

A trade off in designing disks also occurs. In a hard disk, the read/write head typically does not touch the disk, but rather "flies" over the surface of the disk, as close as possible to it. A "read/write" head alternately senses or creates non-random sequences as of polarity signals or the absence thereof in transferring "data" to and from a magnetic storage device. The condition of the head touching the disk is referred to as a head "crash" and causes catastrophic loss of the data encoded thereupon. Typically, as the height of the head over the disk decreases, the storage capacity and access speed can increase. However, once a certain small height occurs, the smoothness of the surface of the disk attains critical importance.

In contrast with the existing drive technology, the foundation of yesterday's memory used in the first computers were iron core memories. Core memories were long forgotten as slow, large, expensive, and power hungry memory devices. However, a major breakthrough was made that allows one to take advantage of the first core memory's non-volatile characteristics and also reduce their size a million fold.

Even though, the theory of ferroelectrics was discovered in 1921, few attempts have been made to use this technology; the first ferroelectric integrated circuits of small memory storage are just beginning to appear. Ferroelectrics exhibit the same general characteristics of superconductor materials now in development.

Ferroelectric materials with non-volatile Q-V (charge voltage) hysteresis loop characteristics similar to B-H (flux-inductance) loops in iron magnetics will take the place of the rotating memory disk.

There have been many prior art attempts to maximize the access rate and storage capacity of a disk. Typically, these involve improvements to the heads, controller circuitry and disk composition. It is an object of the present invention to provide improvements in all of the above-mentioned areas, and to produce a system that out-performs the state of the art as it now exists.

SUMMARY OF THE INVENTION

A 5.25/3.50 inch removable ferroelectric nonvolatile memory drive takes advantage of high capacity Winchester drive controller technology and controller software already established over the past years to modernize the 5.25/3.5 inch Winchester drive. FRAM memory boards with several boards stacked together allow much higher amounts of data storage and 100 times the rate of present day data transfer operations. No moving parts will allow unlimited number of FRAM drives to be parallel I/O bused together during read/write operations. Solid state integrated non-volatile memory will be able to operate in much wider temperature and altitude ranges improving reliability. Head settle and access times for the FRAM drive is near zero since there are no moving parts.

It is very practical and cost effective to develop a 5.25/3.5 inch FRAM pack Winchester drive that uses the 5.25/3.5 inch fixed disk Winchester technology. By using a 5.25/3.5 inch FRAM memory drive design, high capacity (40 megabytes and up) and much high data transfer rates (25 megabit/sec and up) can be realized. The 5.25/3.5 inch FRAM pack drive fits into a niche already created for such a product. The drive is completely hardware and software interchangeable with today's ST506/512, SASI, ESDI and SCSI I/O Winchester drive controller electronics and software.

BRIEF DESCRIPTION OF THE DRAWINGS

The accompanying drawings, which are incorporated in and form a part of the specification, illustrate an embodiment of the invention and, together with the description, serve to explain the principles of the invention. In the drawings:

FIG. 10 is a diagram of an Index Generator circuit used in the ferroelectric Status Control circuit shown in FIG. 1;

FIG. 11 is a diagram of an Output Data Control Buffer circuit used in the Input Output Buffer circuit shown in FIG. 1;

FIG. 12 is a Block Diagram of a ferroelectric Non-Volatile Integrated Circuit shown in FIG. 1.

DETAILED DESCRIPTION OF A PREFERRED EMBODIMENT

Figure 1:
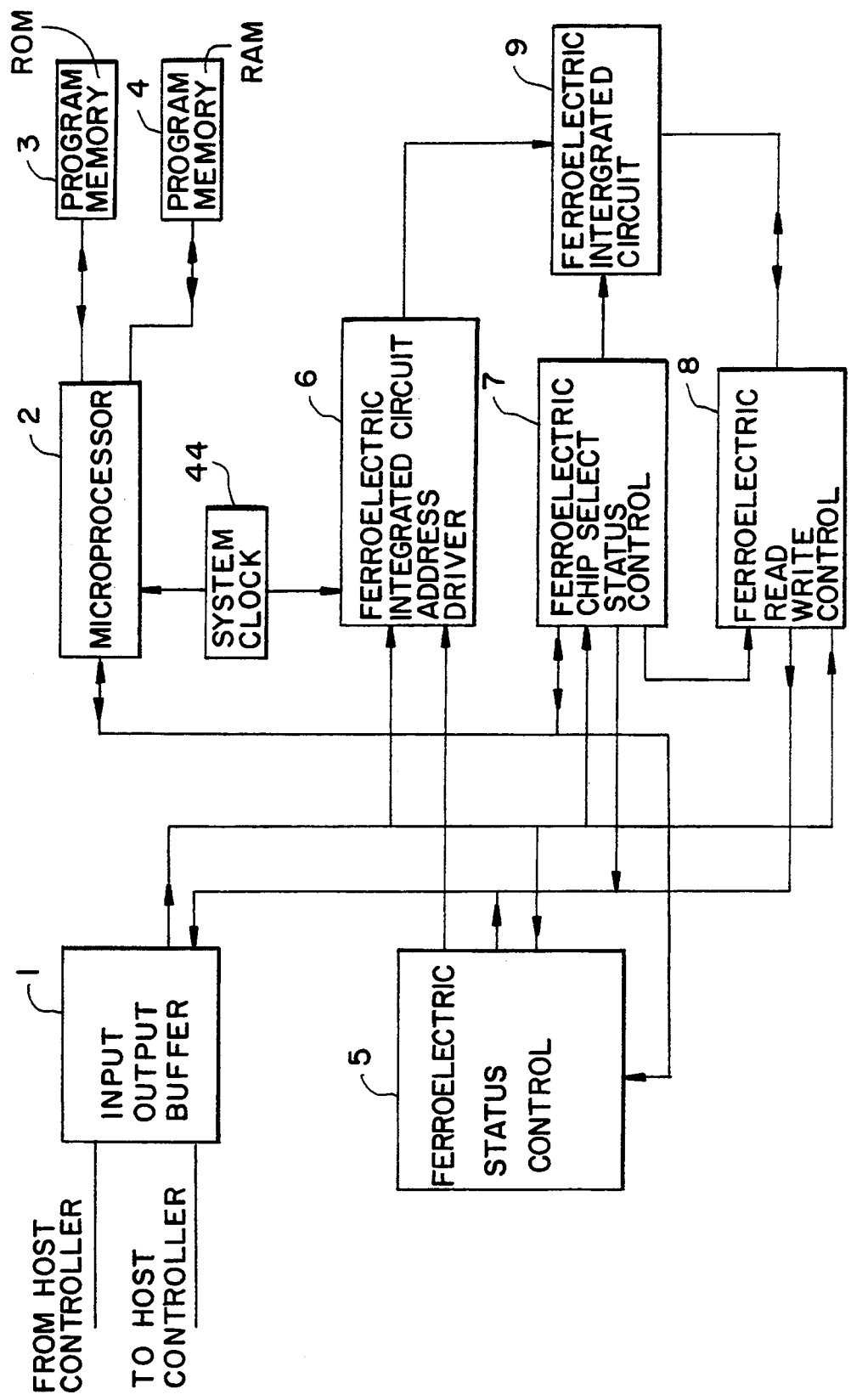
FIG. 1 is an overall block diagram of an exemplary Removable FRAM Pack ferroelectric Drive in accordance with the present invention.
Figure 2:
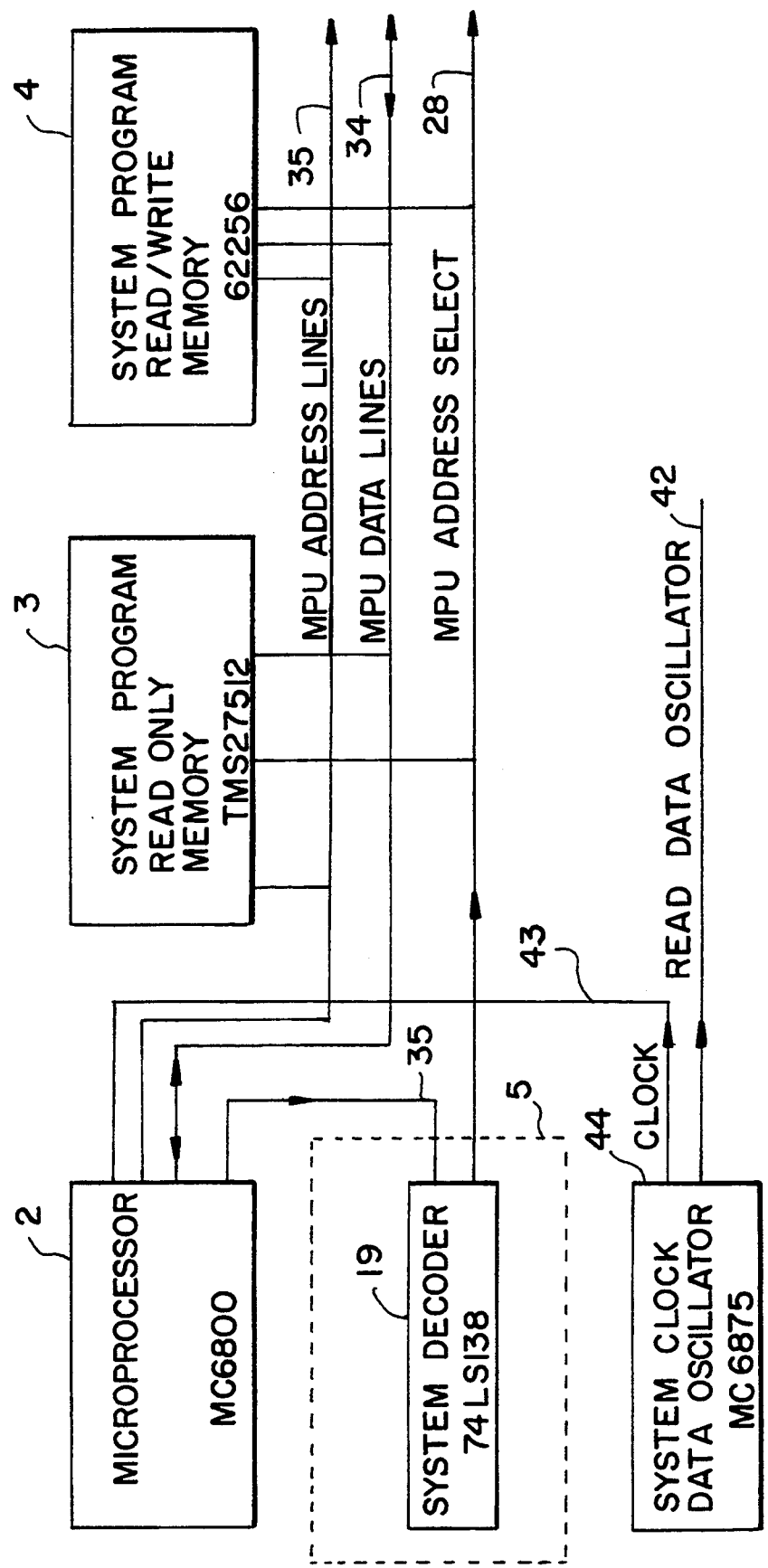
FIG. 2 is a schematic diagram of a microprocessor drive circuit including portions of the circuits 2, 3, 4, 5 and 44 shown in FIG. 1.
Figure 3:
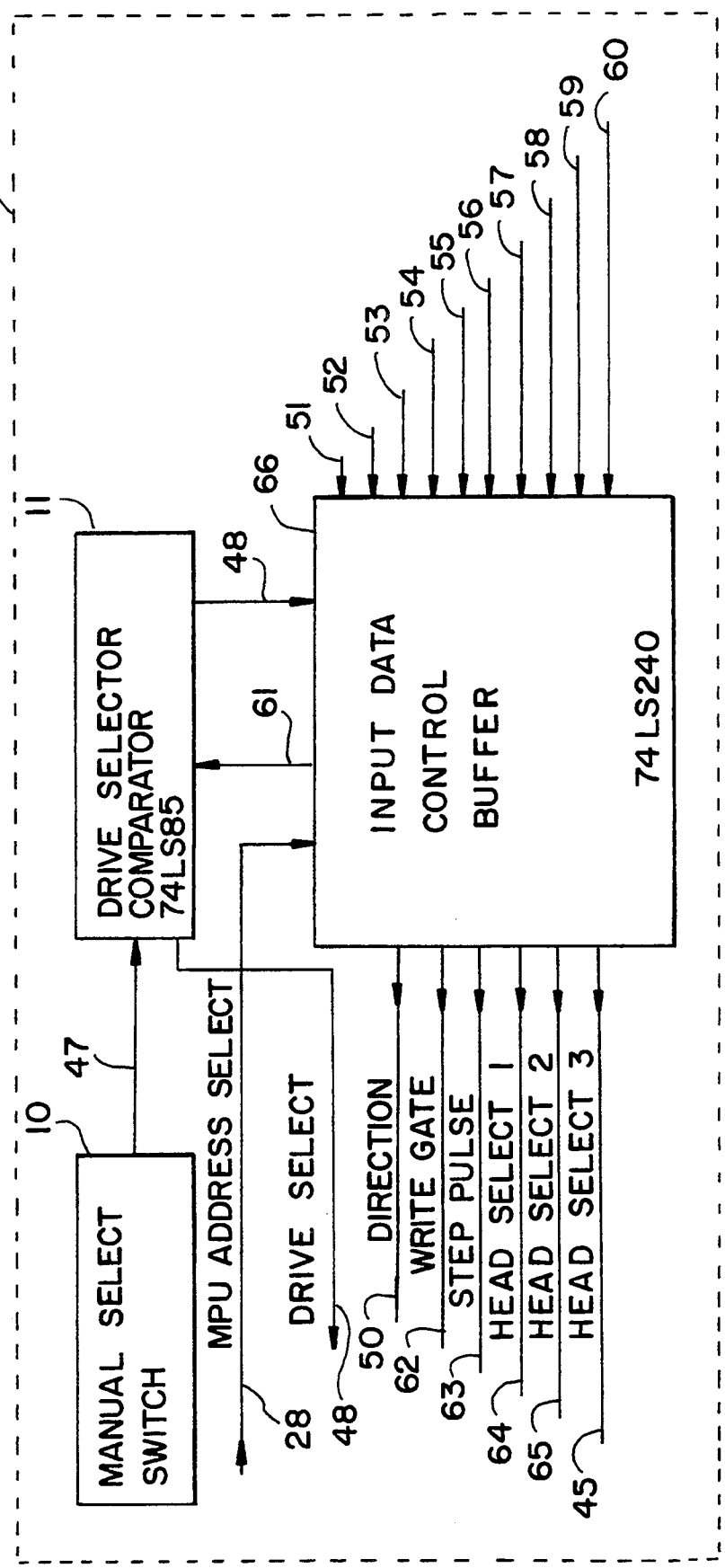
FIG. 3 is a schematic diagram of the buffer circuit shown in FIG. 1.
Figure 4:
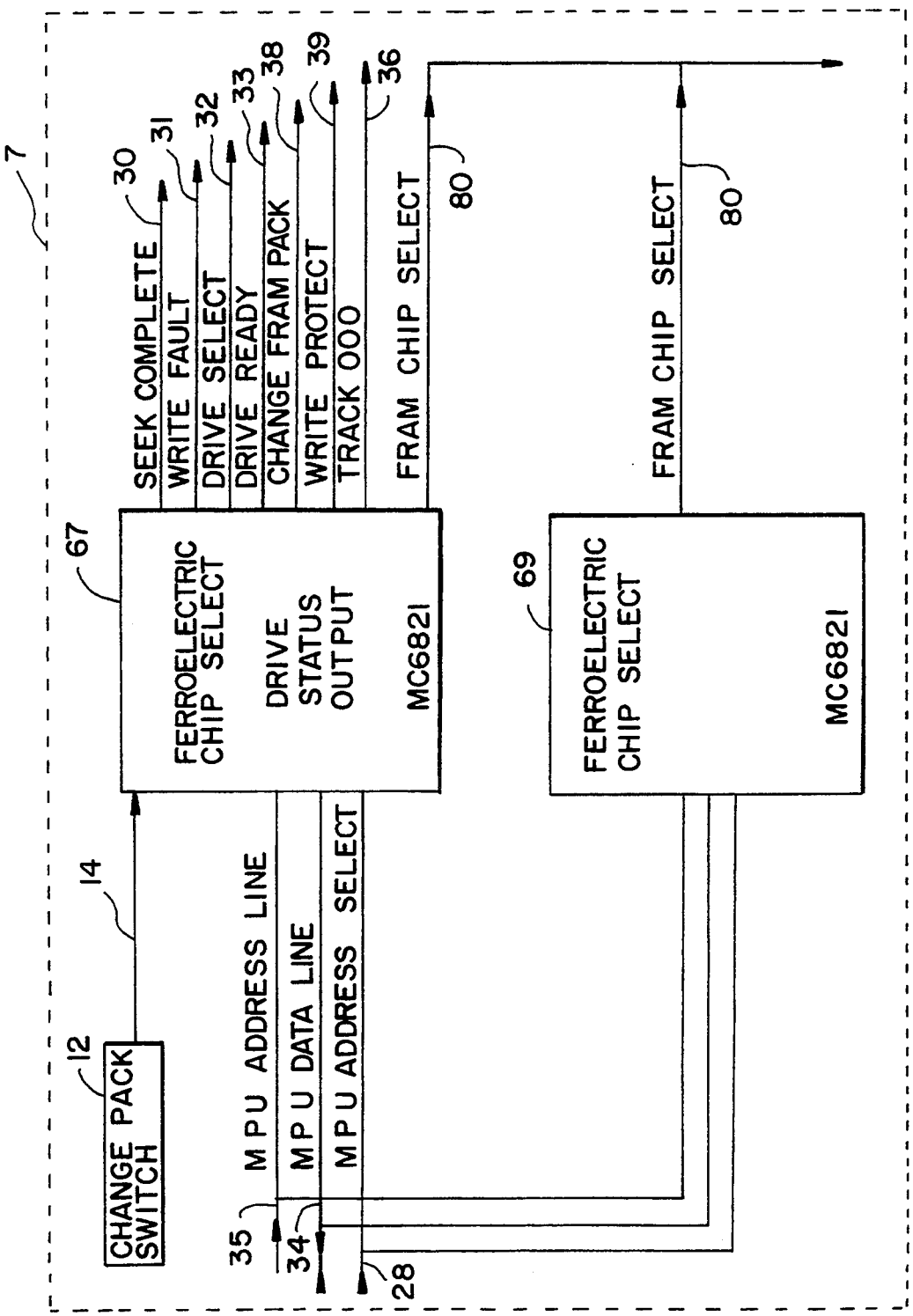
FIG. 4 is a schematic diagram of a Change Pack Switch, Drive Status, and output circuit, and ferroelectric Chip Select circuit used in the ferroelectric Chip Select Status Control circuit shown in FIG. 1.
Figure 5:
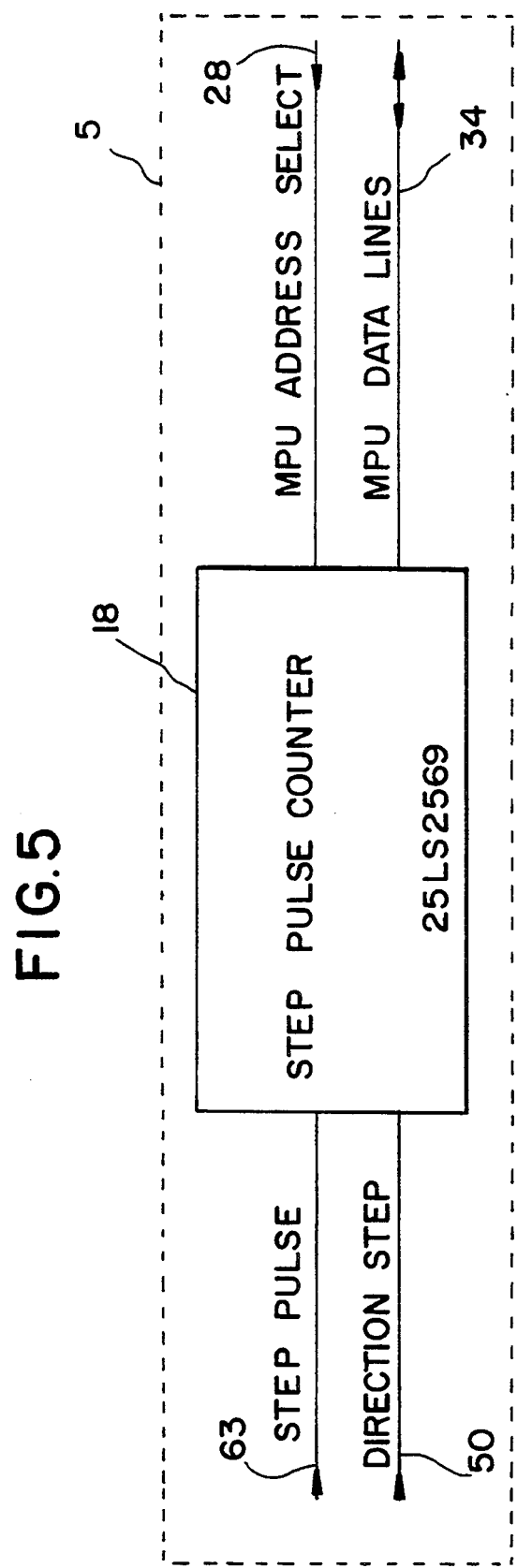
FIG. 5 is a diagram of a Step Pulse Counter circuit used in the ferroelectric Status Control circuit shown in FIG. 1.
Figure 6:
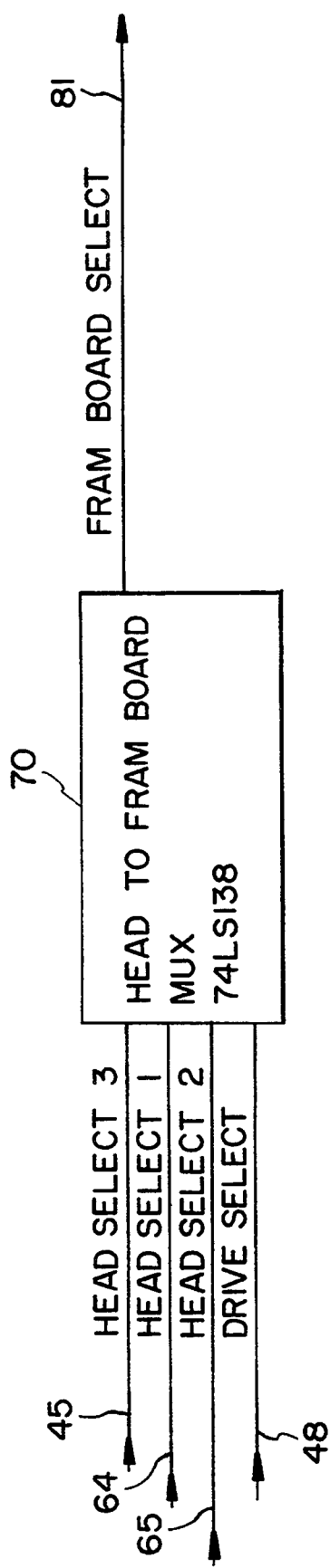
FIG. 6 is a diagram of a Head to FRAM Mux circuit used in the ferroelectric Chip Select and Status Control circuit shown in FIG. 1.
Figure 7:
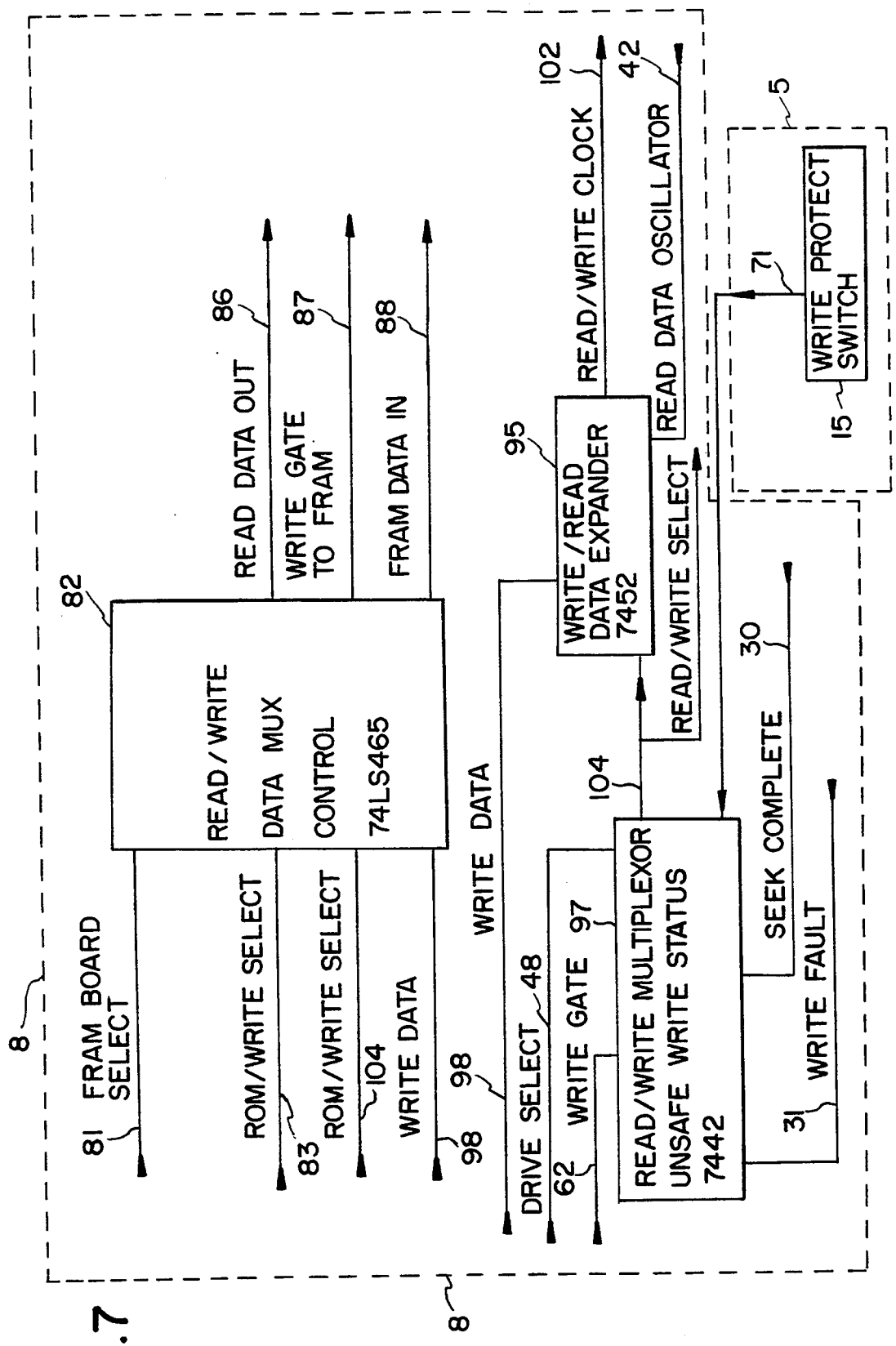
FIG. 7 is a diagram of a read/write Data Mux Control, read/write Multiplexor and Unsafe Write Status, Write/Read Data Expander, and write Protect Sensor circuit used in the ferroelectric read/write Control circuit and ferroelectric Status Control circuit shown in FIG. 1.
Figure 8:
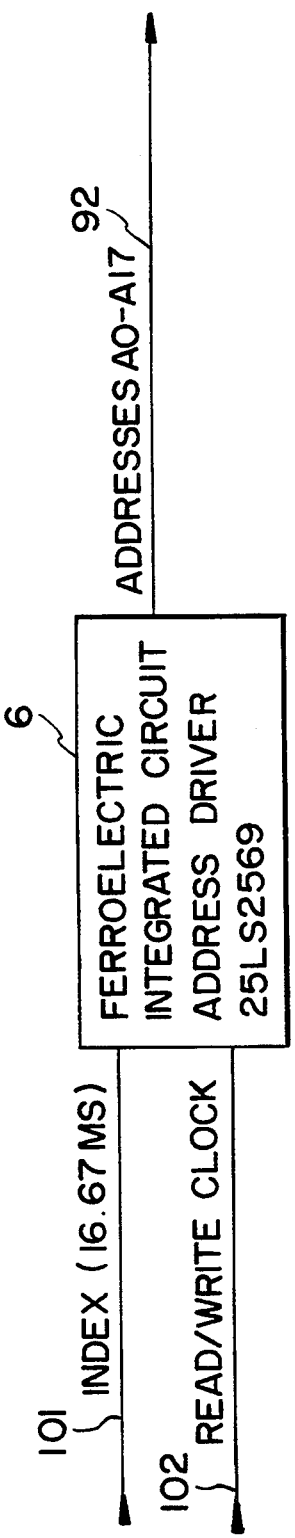
FIG. 8 is a diagram of the ferroelectric Integrated Circuit Address Driver used in FIG. 1.
Figure 9:
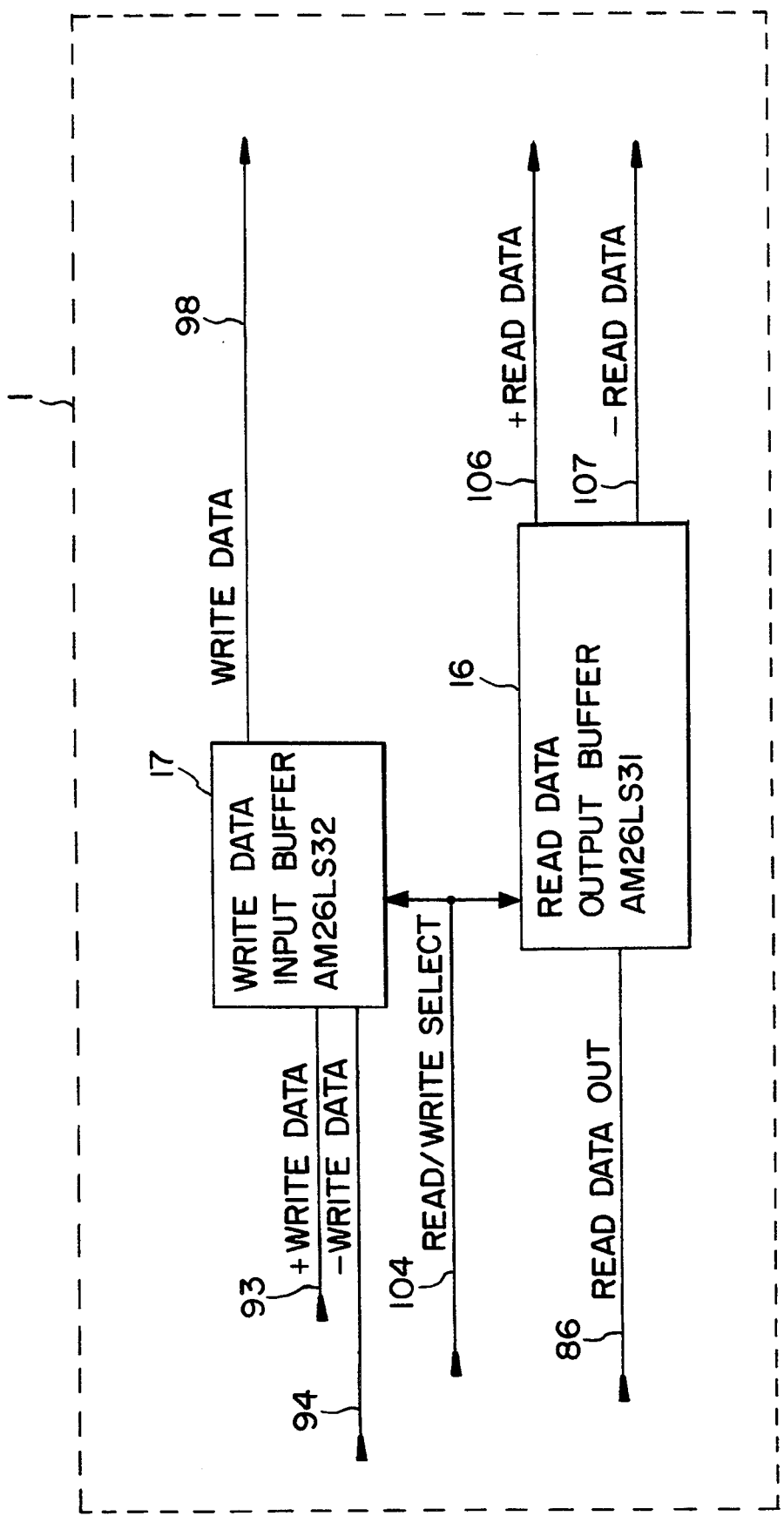
FIG. 9 is a diagram of a Write Data Input Buffer and Read Data Output Buffer circuit used in the Input Output Buffer circuit used in FIG. 1.

FIG. 1 is an overall circuit of a presently preferred exemplary embodiment of a 5.25/3.5 inch removable FRAM pack Winchester drive in accordance with the present invention. Referring to FIG. 2 the circuit in FIG. 1 further includes Microprocessor 2, System Program Read only Memory 3, System Program Read/-Write Memory 4, System Clock Data Oscillator 44. FIG. 3 includes Manual Select Switch 10, Drive Selector Comparator 11, Input Data Control Buffer 66. FIG. 4 includes Change Pack Switch 12, ferroelectric Chip Select/Drive Status output 67, ferroelectric Chip Select 69. FIG. 5 includes Step Pulse Counter 18 and FIG. 6 includes Head to Fram Board Mux 70. FIG. 7 includes read/write Data Mux Control 82, read/write Data Expander 95, read/write Multiplexor/unsafe Write Status 97, Write Protect Sensor 15. FIG. 8 includes ferroelectric Integrated Circuit Address Driver 6. FIG. 9 includes Write Data Input Buffer 17, Read Data Output Buffer 16. FIG. 10 includes 16.67 millisecond (MS) Index Signal Generator 96. FIG. 11 includes Output Data Control Buffer 37. Referring to FIG. 12, includes ferroelectric Non-Volatile Integrated Circuit 9.

The signal 48 (FIG. 3) from Drive Selector Comparator 11 is a drive select command indicative of a signal 61 from Input Data Control Buffer 66. When signal 61 matches the setting in Manual Select Switch 10 signal 47, the signal 48 is also produced by Drive Selector Comparator 11, and goes to a low logic level to enable further action by the drive Head to Fram Board Mux 70 (FIG. 6), read/write Multiplexor Unsafe Write Status 97 (FIG. 7), 16.67 ms Index Signal Generator 96 (FIG. 10), Output Data Control Buffer 37 (FIG. 11), and ferroelectric Chip Select/Drive Status Output 67 (FIG. 4). The signals head select 64, 65, 45, direction 50, write gate 62, step pulse 63 (FIG. 3), +write data 93 (FIG. 4), and −write data 94 will all then be connected through internal circuit connections which couple lines 58 to 64, 59 to 65, 60 to 45, 55 to 50, 56 to 62, 57 to 63, 93 to 98, 94 to 98 through actions of the micro processing unit (MPU) 2, System Decoder 19, and Input Data Control Buffer 66.

The microcomputer 2 will now be discussed. (See FIG. 2). The microprocessor system 2 includes various items which are now commercial items and which are interconnected in a well-known manner. For example, the Motorola, Inc. MC6800 series of microprocessor components designed to be easily interfaced with common data and address busses and controlled through commonly used control functions. The Microprocessor (MPU) 2 has a purpose of logically controlling system functions through the use of Read Only Memory (ROM) 3 Random Access Memory (RAM) 4 and firmware programs using microprocessor instruction codes. MPU 2 generates seek, incomplete, drive ready, and write fault signals for Output Data Control Buffer 37 (FIG. 11) and calculates the FRAM integrated circuit 9 to read data from read/write data mux control 52. ROM 3 holds instructions for the system start-up, arithmetic instructions for FRAM Chip Select and drive status data to Input Output Buffer. RAM 4 holds temporary storage of the data FRAM Drive system status and control.

Change Pack Switch 12 (FIG. 4) detects whether a FRAM pack is in place. Drive Selector Comparator 11 (FIG. 3) compares the Manual Select Switch 10 signal 47 and Input Data Control Buffer 66 signal 61 and produces signal 48 drive select which is output to Head to Fram Board Mux 70, read/write Multiplexor 97, and 16.67 ms Index Signal Generator 96. Drive Selector 11 signal 48 enables the Index Pulse Generator 96 (FIG. 10) to produce an index pulse output signal 101 every 16.67 milliseconds to Output Data Control Buffer 37 (FIG. 11) and ferroelectric Integrated Circuit Address Driver 6 (FIG. 8). Step Pulse Counter 18 signal 63 (FIG. 5) is a step pulse input from Input Data Control Buffer 66 (FIG. 3) signal 63 and is used to toggle the counter up/down.

The most significant bit is determined as follows. Input Data Control Buffer 66 signal 50 input to Step Pulse Counter 18 signal 50 tells the up/down counter in Step Pulse Counter 18 to count up or to count down. Step Pulse Counter 18 signal 34 is read by the MPU 2 (FIG. 2) signal 34 and represents 12 bit binary inputs of mathematical weight represented by their placement. MPU 2 reads from ROM 3 to retrieve an add/subtract software routine to calculate a desired FRAM 256 k memory block, in order to select the FRAM 256 k memory block of the desired position, by selecting the FRAM 256 k memory block from its present known position. The desired position will be an absolute count calculated from Step Pulse Counter 18 signal 34.

The least significant bit is determined as follows. System Clock Oscillator 44 (FIG. 2) signal 42 is input tp ferroelectric Integrated Circuit Address Driver 6 (FIG. 8) use signal 102 to generate strobing addresses A0–A17 for FRAM 9 read data.

Ferroelectric Integrated Circuit Address Driver 6 signal 92 output is a 5 Mhz oscillator incremental or strobing address counter necessary to create data cell times for data from the FRAM 9 (FIG. 12). MPU 2 signal 34 sends a state table to Ferroelectric Chip Select Drive Status Output 67, 69 (FIG. 4) where the state table data is decoded and output to Write Protect Signal 39, Drive Ready signal 33, Track 000 signal 36, Seek Complete signal 30, FRAM Chip Select signal 80, Write Fault signal 31, Change FRAM Pack 38, Write Protect signal 39. Head to FRAM Board Multiplexor Mux 70 (FIG. 6) signal 81 enables read/write Data Mux Control 82 (FIG. 7) which enables the selected FRAM board to read and write data to FRAM 9. System Decoder 19 signal 28 is used for memory mapping the hardware addresses of the microprocessor system to control the FRAM Drive. Write protect Sensor 15 (FIG. 7) signal 71 is logic level low to the read/write Multiplexor Unsafe Write Status 97 and prevents any writing to any FRAM integrated circuit 9 if the sensor has been activated. Ferroelectric Chip Select Drive Status Output 67 (FIG. 7) signals 30, 31 when in a logic high allow setting read/write Multiplexor Unsafe Write Status 97 (FIG. 7) signal 104 for logic high read or a logic low for write. System Ram 4 is used to store system address data, system status, drive status, and error conditions. Data to the FRAM drive can be written when the read/write Data Mux Control 82 (FIG. 7) signal 87 is logic low and signal 88 has serial data present. Data to the FRAM drive can be read when the read/write Data Mux Control 82 signal 88 is logic high. When the read/write FRAM board is set at the desired electronic selection, read/write Data Mux Control 82 is used by the FRAM drive to read/write prerecorded frequency pattern placed on the removable FRAM Pack integrated circuits. The Head to FRAM Board Mux 70 (FIG. 6) signal 81 selects the board with which it will read/write, read/write Data Mux Control 82 (FIG. 7) signals 88, 87, 83 allows data to transfer, Write Data Input Buffer 17 (FIG. 9) signal 98 allows write data to FRAM 9 and Read Data Output Buffer 17 signal 86 allows read data from FRAM 9. The recorded data passes through Write Data Input Buffer 17 signals 93,94 and Read Data Output Buffer 16 signals 106,107 and is thereby sent out on the ST506/SASI/ESDI/SCSI bus to the Winchester controller PCB, i.e. ESDI (Enhanced Small Disk Interface), SMD (Small Memory Device), SASI (Sugart Associates Standard Interface) and SCSI (Small Computer Systems Interface) type signals for conversion and interpretation at the Winchester controller.

Thus, this system which has described above allows use of the removable FRAM Pack to replace a Winchester drive, and allows it to interface with the ST506/SMD/SASI/ESDI/SCSI standard interface in place of the Winchester drive.

The removable FRAM pack drive used with this system is formatted for, typically, 384 and up tracks per inch (TPI) yielding 16,262 bits per inch and up when used, the ferroelectric non-volatile memory ic shall consist of one ic having 262,144 individual memory addresses with each capable of saving (write) or retrieving (read) one binary weighted bit. The drive's printed circuit boards ("PCB") shall consist of 20 ferroelectric ics with each of the ferroelectric non-volatile ic's being able to store 15 tracks of serial data and where 262,144 times 20 ics=5,242,880 binary bits of information stored on a PCB. Each PCB shall be the equivalent of one Winchester disk drive head, which will achieve maximum unformatted data interchange of 40 megabytes for each 8 PCB FRAM drive. As technology increases and densities of equipment get higher, larger storage ferroelectric non-volatile integrated circuits will be used to increase drive capacity.

The FRAM pack drive is a removable FRAM pack direct access storage device for receiving and transmitting digital information between computer and system components. The device includes two parts; FRAM and printed circuit board.

The FRAM unit is comprised of a film layer of ferroelectric material made of lead zirconate titanate laid underneath a silicon etched substrate consisting of thousands of npn and pnp nodes joined together in tandem, allowing current amplification and thereby causing the underlying electro/capacitive film to act as a nonlinear capacitor of positive and negative voltage aligning themselves in the direction of current flow. A voltage polarity in a positive or negative or orientation will close or create a low resistance to current in its associated npn or pnp junction and a negative/positive polarity will open or create an opposite high resistance to current. The gain of the associated circuitry will thus be effected creating a high (+5v) or low ground level at the data input/output pin of the device. A printed circuit board may be constructed of epoxy/fiberglass used for holding the FRAM ic and associated logic.

Although only a few presently preferred exemplary embodiments have been discussed in detail above, those of ordinary skill in the art will realize that many modifications are possible without departing from the scope and spirit of the present invention as defined in the following claims.

What is claimed is:

1. A solid state, non-volatile random access memory (RAM) pack for emulating a rotating disk drive peripheral device in a host data processing system in response to control signals from the host data processing system, the control signals including stepping and stepping direction signals representing movement from a present location to a desired location; the non-volatile random access memory pack using the control signals to address a selected block of solid state memory within the memory pack using a given controller specification including the stepping and stepping direction signals and an indexing control signal, said memory pack comprising:
a removable solid state non-volatile random access memory means for storing data, said random access memory means comprising a plurality of ferroelectric random access memory integrated circuits, each including a ferroelectric film layer underneath a silicon etched substrate;
interface means for coupling the random access memory means to said host data processing system, the interface means including:
controller means for receiving control signals used for a disk drive peripheral device;
means for generating from the control signals an address for addressing a section of said random access memory means, said section including a plurality of data storage locations; and
means for sequentially addressing said data storage locations within the selected section when reading data from the random access memory means to the disk drive controller and when writing data to the random access memory means from the disk drive controller; and from the host data processing system, including means for providing status signals including an index signal to the host data processing system.

2. The apparatus of claim 1 wherein the means for generating includes a microprocessor means for calculating a desired address from a previous head location and a presently chosen address, and associated control signals.

3. A solid state, non-volatile random access memory pack for emulating a rotating disk drive used as a peripheral device in a host data processing system in response to control signals from the host data processing system, the control signals including head select, stepping and stepping direction signals representing movement from a present position to a desired position; said memory pack comprising:
a plurality of non-volatile ferroelectric random access memory (RAM) chips mounted in a predetermined manner on a plurality of printed circuit boards;
interface means for receiving and sending the control signals, and status and data signals, between the memory pack and the host data processing system;
microprocessor means for storing a previous position and calculating a new position from the head select, stepping and stepping direction signals; the microprocessor means further mapping the new position to a predetermined address for a section of memory in the plurality of ferroelectric RAM chips;
address decoder means for selecting one of said ferroelectric RAM chips and providing a most significant bit address for the section of memory from the predetermined address;
means for generating a least significant bit address for strobing the section of memory in order to access data stored within the section of memory; and
means for multiplexing data signals between a selected one of said ferroelectric RAM chips and the interface means.

4. The apparatus of claim 3 wherein the memory pack has a predetermined size for removably inserting into a hole in an enclosure of the hard data processing system for a rotating disk drive unit.

5. The apparatus of claim 3 further comprising means for generating status signals provided to the interface means; and
means for communicating to the host data processing system the status signals, including an index signal.

6. The apparatus of claim 5 further comprising means for generating a drive select signal, the interface means receiving said drive select signal and comparing it to a present drive select signal for enabling the memory pack for reading and writing operations.

7. A data processing system comprising:
central processing unit means;
controller means for a peripheral rotating disk drive, the controller means coupled with the central processing unit means;
mounting means for removably receiving a non-volatile, non-rotating solid state ferroelectric random access memory pack, the mounting means coupling the memory pack for communication to the controller means; the memory pack including:
a plurality of non-volatile ferroelectric random access memory (RAM) chips mounted in a predetermined manner on a plurality of printed circuit boards;

interface means for receiving and sending control, status and data signals between the memory pack and the controller means, the control signals from the controller means including head select, stepping and stepping direction signals representing movement from a present position to a desired position;

microprocessor means for determining from the head select, stepping and stepping direction signals a predetermined address for a section of memory in the plurality of ferroelectric RAM chips;

address decoder means for selecting one of said ferroelectric RAM chips and providing a most significant bit address for the section of memory from said predetermined address;

means for generating least significant bit addresses for strobing the section of memory in order to access data stored within the section of memory; and means for multiplexing data signals between a selected one of said ferroelectric RAM chips and the interface means.

8. The apparatus of claim 7 further comprising a rotating, magnetic disk drive coupled to the controller means, and a drive select signal for selecting between the memory pack and the magnetic disk drive.

9. A method for interfacing a controller for a peripheral rotating disk drive unit for a host data processing system to a solid state, non-volatile ferroelectric random access memory, comprising; receiving head select, stepping and stepping direction signals from the host data processing system representing selection of and seeking by a read/write head from a previous track in a rotating disk drive;

determining a new track from the stored previous track;

mapping the new track to a section of the non-volatile, ferroelectric random access memory;

enabling access to the section of the non-volatile ferroelectric random access memory;

strobing the section of the nonvolatile ferroelectric random access memory to read data from and write data to the section;

providing status signals to the host data processing system representing a normally operating rotating disk drive, the status signals including an index signal.

10. The method of claim 9 wherein the step of determining the new track includes the steps of counting pulses in the stepping signal in a direction indicated by the stepping direction signal.

11. The method of claim 9 wherein the step of mapping is performed by a microprocessor.

12. The method of claim 9 wherein the step of enabling access to the section of the non-volatile ferroelectric random access memory includes the steps of:

selecting a chip, from a plurality of chips comprising the non-volatile ferroelectric random access memory; and multiplexing read/write command signals and data signals to the plurality of chips comprising the non-volatile ferroelectric random access memory.

* * * * *